United States Patent
Mastrobattisto et al.

(10) Patent No.: US 11,752,594 B2
(45) Date of Patent: Sep. 12, 2023

(54) ARTICLES HAVING DIAMOND-ONLY CONTACT SURFACES

(71) Applicant: M Cubed Technologies, Inc., Newtown, CT (US)

(72) Inventors: Daniel Mastrobattisto, Southbury, CT (US); Edward Gratrix, Monroe, CT (US); Prashant Karandikar, Avondale, PA (US); William Vance, Newtown, CT (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 15/724,248

(22) Filed: Oct. 3, 2017

(65) Prior Publication Data
US 2018/0099379 A1    Apr. 12, 2018

Related U.S. Application Data

(63) Continuation of application No. PCT/US2016/026272, filed on Apr. 6, 2016.
(Continued)

(51) Int. Cl.
*B24D 3/10* (2006.01)
*C04B 35/573* (2006.01)
(Continued)

(52) U.S. Cl.
CPC .............. *B24D 3/10* (2013.01); *B24B 53/047* (2013.01); *C04B 35/573* (2013.01); *C04B 35/80* (2013.01);
(Continued)

(58) Field of Classification Search
CPC ....... B24D 3/10; B24B 53/047; C04B 35/573; C04B 35/80; C04B 35/78; C04B 35/56;
(Continued)

(56) References Cited

U.S. PATENT DOCUMENTS 6,159,087 A * 12/2000 Birang ................. B24B 53/017
451/526
6,190,240 B1 * 2/2001 Kinoshita ............ B24B 53/017
451/443
(Continued)

FOREIGN PATENT DOCUMENTS

JP         3250290 B2      1/2002
WO     WO99/12866    *  3/1999  ........... C04B 35/573
(Continued)

OTHER PUBLICATIONS

NPL #1 (Yamaguchi et al. Sep. 2008, Electric Discharge Machining for Silicon Carbide and Related Materials, https://www.scientific.net/MSF.600-603.851).*
(Continued)

*Primary Examiner* — Joel D Crandall
*Assistant Examiner* — Michael A Gump
(74) *Attorney, Agent, or Firm* — Blank Rome LLP

(57) ABSTRACT

Diamond-containing articles such as composite materials shaped as some specific article, can be engineered such that bodies that contact the article only contact diamond. In an embodiment, the article may be in the form of equipment for handling semiconductor wafers such as vacuum or electrostatic chucks. In one embodiment, the diamond-containing article can be a composite of diamond particulate reinforcing a Si/SiC body such as reaction-bonded SiC. Lapping the diamond-reinforced RBSC body with progressively finer diamond grit removes some of the SiC/Si matrix material, leaving diamond particles of uniform height "standing proud" above the rest of the surface of the formed article. Further, if the diamond-containing article is sufficiently electrically conductive, it may be machinable using electrical discharge machining.

7 Claims, 9 Drawing Sheets

Related U.S. Application Data

(60) Provisional application No. 62/143,748, filed on Apr. 6, 2015.

(51) Int. Cl.
  *H01L 21/687* (2006.01)
  *C04B 35/80* (2006.01)
  *B24B 53/047* (2006.01)
  *C30B 29/04* (2006.01)

(52) U.S. Cl.
  CPC ........ *C30B 29/04* (2013.01); *H01L 21/68757* (2013.01); *C04B 2235/427* (2013.01); *C04B 2235/428* (2013.01); *C04B 2235/5436* (2013.01)

(58) Field of Classification Search
  CPC .............. C04B 29/04; C04B 2235/427; C04B 2235/428; C04B 2235/5436; C04B 41/5002; H01L 21/68757; H01L 21/683–68792; B25J 11/0095; B23Q 3/062; B23Q 7/043; B23Q 7/046; B23Q 7/047
  USPC ............................ 451/56, 309, 443, 444, 534
  See application file for complete search history.

(56) References Cited

U.S. PATENT DOCUMENTS

| | | | |
|---|---|---|---|
| 6,551,176 B1* | 4/2003 | Garretson | B24B 53/017 451/443 |
| 7,097,542 B2* | 8/2006 | Skocypec | B24B 53/017 451/443 |
| 2002/0182401 A1* | 12/2002 | Lawing | B24D 18/00 428/323 |
| 2003/0092558 A1 | 5/2003 | Aghajanian | |
| 2005/0118939 A1* | 6/2005 | Duescher | B24D 11/00 451/527 |
| 2005/0124266 A1 | 6/2005 | Henderson | |
| 2008/0209816 A1 | 9/2008 | Sung | |
| 2010/0261419 A1* | 10/2010 | Sung | B24B 53/017 451/443 |
| 2012/0220208 A1 | 8/2012 | Sung | |

FOREIGN PATENT DOCUMENTS

| | | |
|---|---|---|
| WO | WO 1999/012866 | 3/1999 |
| WO | 0242240 A2 | 5/2002 |
| WO | 2013113569 A1 | 8/2013 |

OTHER PUBLICATIONS

International Search Report dated Jul. 8, 2016 for International Application No. PCT/US16/26272.

* cited by examiner

ARTICLES HAVING DIAMOND-ONLY CONTACT SURFACES

CROSS-REFERENCE TO RELATED APPLICATION(S)

This patent document is a Continuation of International Patent Application No. PCT/US2016/026272, filed on Apr. 6, 2016, which application in turn claims the benefit of U.S. Provisional Patent Application No. 62/143,748, entitled "Articles having diamond-only contact surfaces", filed on Apr. 6, 2015 in the name of inventors Daniel Mastrobattisto et al. The entire contents of these two patent applications are incorporated by reference herein.

STATEMENT REGARDING FEDERALLY SPONSORED RESEARCH

None.

BACKGROUND OF THE INVENTION

1. Field of the Invention

The present invention relates to articles, structures or devices containing diamond engineered such that other bodies that come into contact with the present articles come into contact only with the diamond constituent of the article. In an embodiment, the article may be in the form of equipment for handling semiconductor wafers such as vacuum or electrostatic chucks.

2. Discussion of Related Art

It is critical that such wafers lie flat against the support surface(s) of the chuck. Otherwise, the circuit pattern images that are projected onto the wafer may be out-of-focus. Furthermore, wafer lithography may involve multiple exposures, with re-location of the wafer between exposures. Thus, it is critical that there be a way to precisely re-align the wafer on the chuck relative to its first positioning so that the subsequent exposures will take place in the correct position on the wafer.

As Moore's Law pushes semiconductor feature sizes smaller and smaller, the need for highly precise wafer handling components grows. The difficulty in achieving the required precision also grows. For instance, the silicon wafers upon which are to be manufactured the microprocessor chips must be precisely placed in the processing machines. The wafers typically are handled by vacuum handling equipment. The wafers droop, ever-so-slightly under their own weight. When lowered to a wafer chuck, the drooping wafer "wants" to flatten out, but may be hindered from doing so by friction between the wafer and chuck. This is sometimes referred to as a "stickiness" problem. Metal oxides are notable in this regard, and silicon dioxide is no exception. Among the efforts to solve, or at least ameliorate, this problem, have been to minimize the contact area between the wafer and the chuck. This particular engineering solution may take the form of designing a plurality of "plateaus" of uniform height, typically regularly spaced, into the wafer. These plateaus are called "burls". The burls help in reducing the friction so that the wafer can move laterally across the burls as its flattens out upon settling on the burls. The lateral movement, however, can give rise to another problem—abrasion. The abrasion of the two surfaces moving relative to one another creates at least the possibility that particles of either the burl or wafer material will be created as material may be dislodged from the burl or wafer. Particles that land in a region of the wafer that is to become an integrated circuit likely will cause a defect.

With this in mind, key desired features for wafer handling components are high mechanical stability (high stiffness and low density), high thermal stability (high thermal conductivity and low coefficient of thermal expansion), low metallic contamination, machinability to high tolerance, low wear (to maintain precision), low friction (to prevent wafer sticking), and the ability to be fabricated to sizes of up to 450 mm.

Monolithic diamond has near-perfect properties for the application: mechanical stability, thermal stability, wear resistance, low friction, and zero metallic contamination. However, the costs to produce and machine monolithic diamond in complex sizes up to 450 mm in size are prohibitive.

The instant invention addresses these issues, and provides a solution.

Silicon carbide (SiC) has desirable properties for use as a wafer chuck: low density, low thermal expansion coefficient, and high thermal conductivity, to name three.

Silicon carbide-based bodies can be made to near net shape by reactive infiltration techniques, and such has been done for decades. In general, such a reactive infiltration process entails contacting molten elemental silicon (Si) with a porous mass containing silicon carbide plus carbon in a vacuum or an inert atmosphere environment. A wetting condition is created, with the result that the molten silicon is pulled by capillary action into the mass, where it reacts with the carbon to form additional silicon carbide. This in-situ silicon carbide typically is interconnected. A dense body usually is desired, so the process typically occurs in the presence of excess silicon. The resulting composite body thus contains primarily silicon carbide, but also some unreacted silicon (which also is interconnected), and may be referred to in shorthand notation as Si/SiC. The process used to produce such composite bodies is interchangeably referred to as "reaction forming", "reaction bonding", "reactive infiltration" or "self bonding". Some physical properties for one version of this material, Applicant's Grade SSC-702 reaction bonded SiC ceramic, are provided in Table 1 below. With the exception of the thermal conductivity, which was measured in a temperature range of 21-100 C, all properties were measured at 21 C.

TABLE 1

| Selected physical properties of Grade SSC-702 RBSC ceramic | |
|---|---|
| Nominal SiC Content (vol %) | 70 |
| Nominal Si Content | 30 |
| Bulk Density (g/cm$^3$) | 2.95 |
| Young's Modulus (Gpa) | 350 |
| Poisson's Ratio | 0.18 |
| Flexural Strength (Mpa) | 270 |
| Fracture Toughness (MPa-m$^{1/2}$) | 4 |
| Coefficient of Thermal Expansion (ppm/K) | 2.9 |
| Thermal Conductivity (W/m-K) | 170 |
| Electrical Resistivity (ohm-cm) | 0.2 |

In more recent technology, for added flexibility, one or more materials other than SiC can be substituted for some or all of the SiC in the porous mass. For example, replacing some of this SiC with diamond particulate can result in a diamond/SiC composite.

SUMMARY OF THE INVENTION

The Applicant manufactures such a diamond particle-reinforced composite where the matrix phase is reaction bonded SiC (aka Si/SiC or RBSC). This composite has very high mechanical and thermal stability, can be produced in sizes of 450 mm and greater, and is machinable by electrical discharge machining (EDM), sometimes referred to as "spark discharge machining". Moreover, the Applicant has demonstrated the ability to lap this material in a manner that relieves, or selectively erodes, the matrix phase, leaving the diamond particles standing proud. The lapping process is the same as that known to those skilled in the art: grinding/polishing with progressively finer grades of abrasive. Thus, if the lapped surface is used for semiconductor wafer handling, the wafer will only contact the proud diamond particles. The exposed diamond particles will provide zero metallic contamination, high wear resistance, low friction, high thermal conductivity for heat dissipation, and high stiffness for maintaining a high degree of flatness.

DETAILED DESCRIPTION OF EMBODIMENTS OF THE INVENTION

Table 2 shows that diamond is indeed a low friction material. Listed for comparison are coefficients of friction for diamond and several common materials.

TABLE 2

"General Coefficient of Friction Values"

| Material | Coefficient of Friction |
|---|---|
| Teflon | 0.05 |
| Diamond | 0.1 |
| Glass | 0.5-0.7 |
| SiC | 0.55-0.85 |
| Steel | 0.8 |
| Aluminum | 1.0-1.4 |

Figure 1:
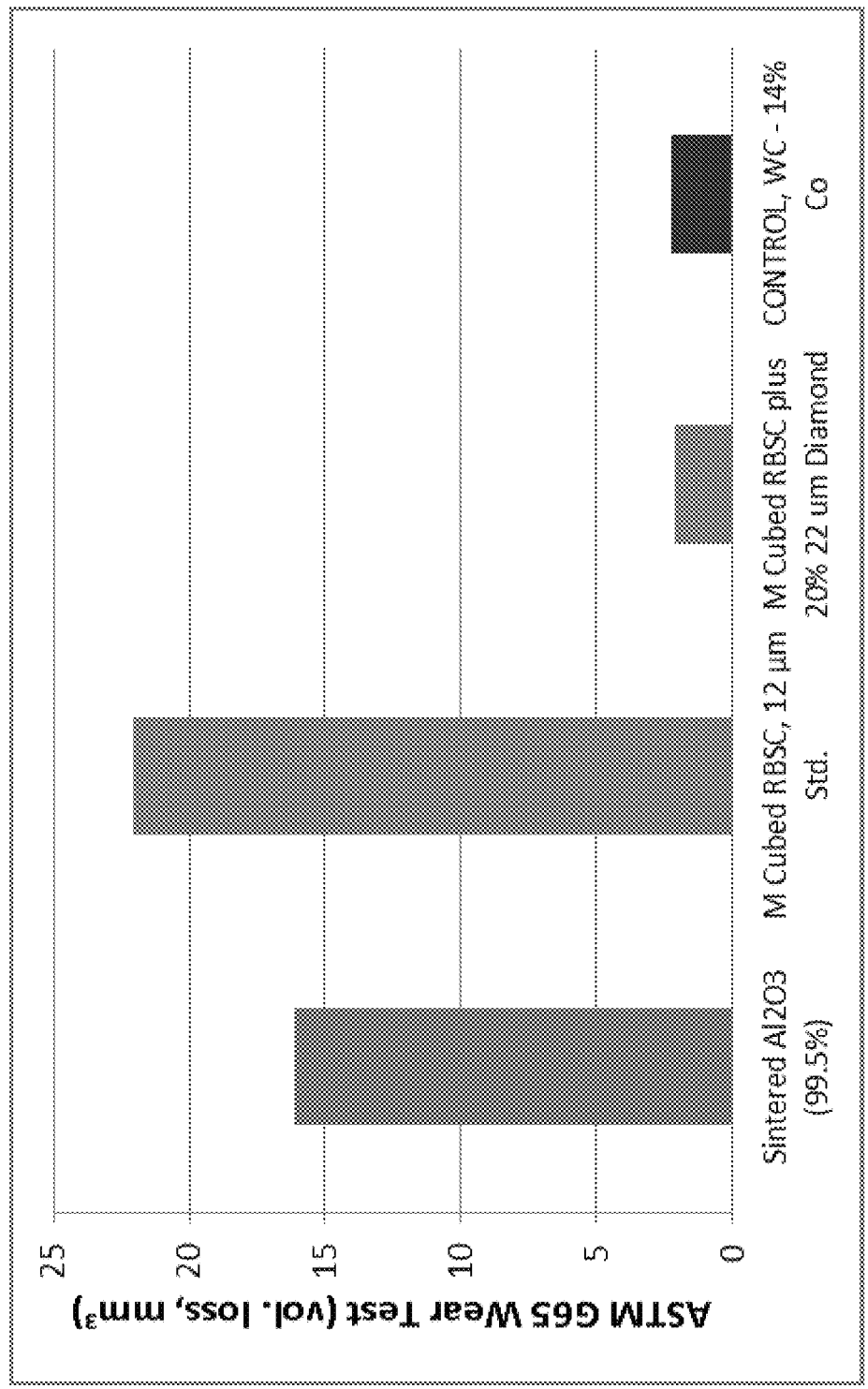
FIG. 1 is a bar graph comparing wear rates of RBSC with and without diamond particle reinforcement, and compared to sintered Al2O3 and WC-14% Co.
Figure 2A:
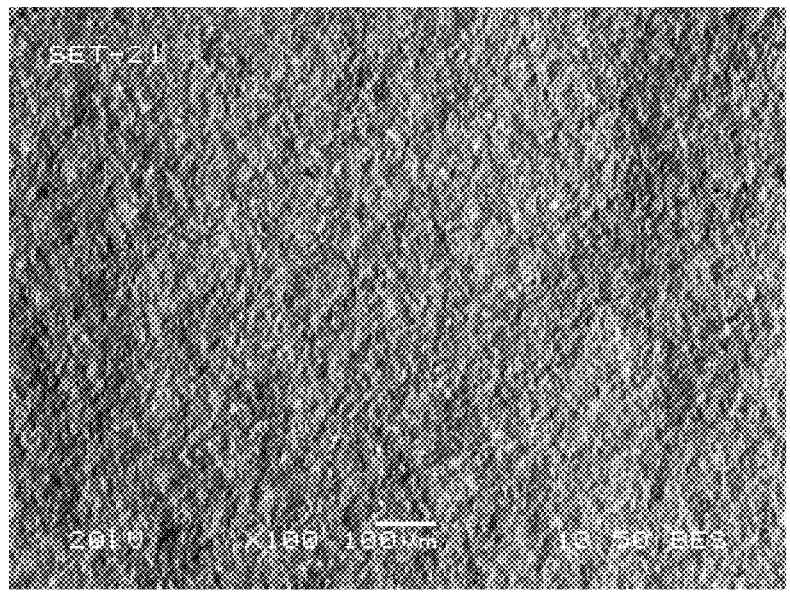
FIGS. 2A and 2B are fracture surfaces of RBSC without and with, respectively, 20 vol % of 22-micron diamond particles.
Figure 2B:
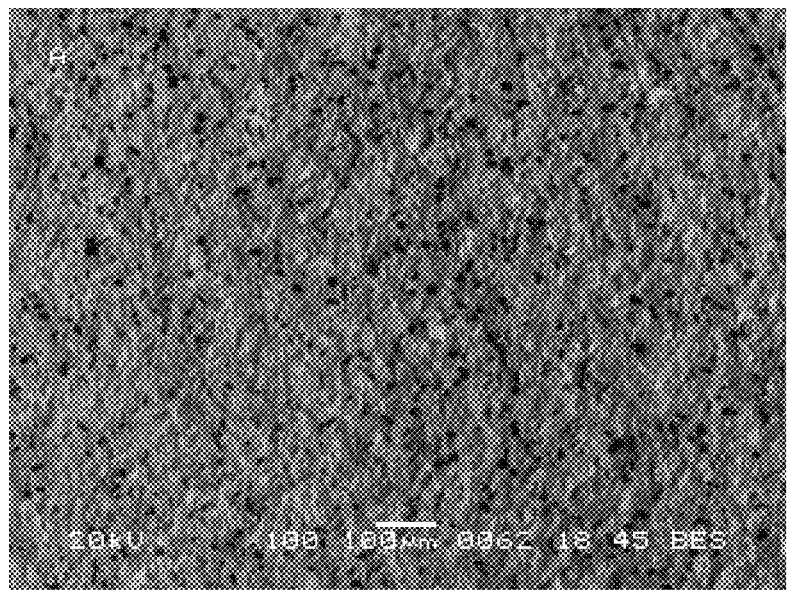

Referring now to FIG. 1, what is depicted is a bar graph showing wear rates of various materials in a standard wear test. The graph shows in particular that addition of 20% of a 22-micron sized diamond particulate to a reaction bonded SiC material dramatically reduces wear rate, to the point where it is comparable to a cemented carbide (WC/Co) cutting tool composition.

The diamond provides very low resistance to sliding (i.e., very low coefficient of friction). Also, diamond cannot form a "sticky" oxide layer because its oxide is gaseous.

Development of EDMable Version of Diamond-Containing RBSiC

Figure 3:
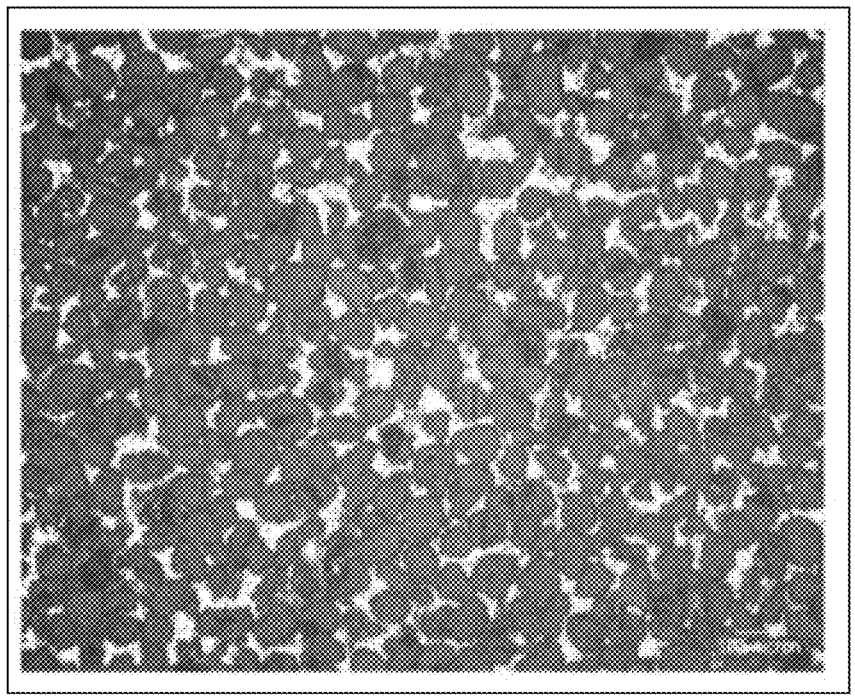
FIG. 3 is an optical photomicrograph of an embodiment of RBSC featuring diamond particulate reinforcement.

Precision components, regardless of what they are made from, often require some kind of finishing operation(s) to impart a precise shape or degree of flatness, smoothness, etc to them. Diamond bodies, or even diamond-containing composites such as diamond-reinforced RBSC, are too hard to machine by conventional methods. Spark discharge machining, often referred to as "electrical discharge machining" (EDM) is a candidate alternative, as long as the bodies to be machined this way have sufficient electrical conductivity. SiC and Si, which are the basis for RBSC, are low electrical conductivity materials. Adding the diamond reinforcement typically reduces electrical conductivity even further. Nevertheless, the Applicant has engineered a diamond-reinforced RBSC composition that shows acceptable EDM capability. Some physical properties for one version of this material, known as THERMADITE™ 100-60 (a trademark of M Cubed Technologies, Inc.), are provided in Table 3 below. With the exception of the thermal conductivity, which was measured in a temperature range of 20-100 C, all properties were measured at 20 C. A representative microstructure of this THERMADITE 100-60 composite material is presented in the polished optical photomicrograph of FIG. 3.

This material can be EDMed down to a feature size of about 100 microns, which is the average grain size of the diamond particulate reinforcement. Note some of the other significant features of this material: its extremely high stiffness, a thermal expansion coefficient that is half that of SiC, a thermal conductivity in excess of copper, a density similar to that of SiC, and capable of being fabricated in relatively large shapes (at least up to about 450 mm diameter). Those skilled in the art will appreciate that many variants of diamond-reinforced RBSC are plausible. Among the parameters that can be varied are diamond content, diamond particulate size and diamond particulate shape.

TABLE 3

Selected physical properties of THERMADITE 100-60 diamond-reinforced RBSC

| | |
|---|---|
| Nominal Diamond Content (vol %) | 60 |
| Nominal Diamond Grain Size (microns) | 100 |
| Bulk Density (g/cm$^3$) | 3.20 |
| Young's Modulus (Gpa) | 650 |
| Poisson's Ratio | 0.14 |
| Coefficient of Thermal Expansion (ppm/K) | 1.5 |
| Specific Heat (J/kg-K) | 720 |
| Thermal Conductivity (W/m-K) | 540 |

More specifically, and in the description and examples to follow, the diamond content can be engineered to range from about 1 volume percent (vol %) to about 70 vol %. The diamond reinforcement can be in the form of particulate, with composites successfully fabricated using diamond particulate having nominal grain sizes of 22, 35 and 100 microns, respectively. The matrix component features SiC produced in-situ and typically some unreacted elemental silicon, as described previously. The amount of elemental Si present in the composite material is highly engineerable as is known by those skilled in the art; for example, can make up a majority of the material by volume (more than 50 vol %), or can be reduced to less than 1 vol %. To enable machining by EDM, however, the Si component may need to be interconnected for adequate electrical conductivity, suggesting quantities of at least about 5-10 vol %. Note, however, that the above-described THERMADITE 100-60 composite material contains about 30-40 vol % Si. This also suggests that the in-situ SiC formed in this composite material is low (e.g., no more than about 10 vol %).

There are at least two types of electrical discharge machining: wire and RAM. The basic principle behind EDM is the flow of significant amounts of electrical energy between an electrode of the EDM device and the workpiece (body to be machined). The electrical energy is in the form of a spark or arc. Wire EDM is useful for making line cuts in the workpiece, just as a band saw would make a line cut. Here, though, the arc melts or evaporates the workpiece material to make the cut, and specifically in the case of THERMADITE 100-60 diamond-reinforced RBSC, the arc melts or evaporates the interconnected Si matrix component. RANI EDM also operates on an electric arc principle, but here the arc is between a shaped electrode and the workpiece. For example, the shaped electrode could be a graphite disc with holes in it. When the graphite disc is brought close to a planar surface of a workpiece, the arc is struck everywhere except where the holes are in the graphite disc. Conducting this process will create a surface on the workpiece featuring pins that are slightly smaller in diameter than the holes in the graphite, and with the pins corresponding in location to the position of the holes in the graphite disc.

Figure 4A:
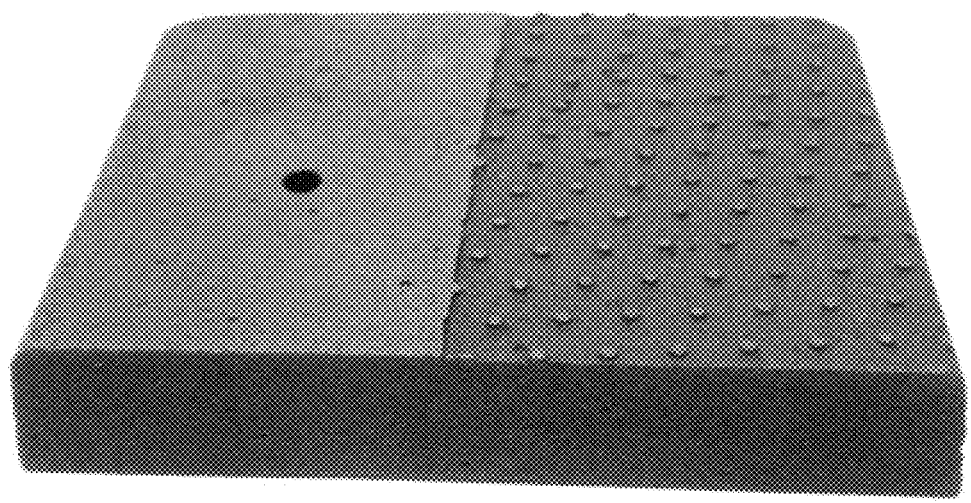
FIGS. 4A and 4B show RBSC articles made by RAM and Wire EDM, respectively.
Figure 4B:
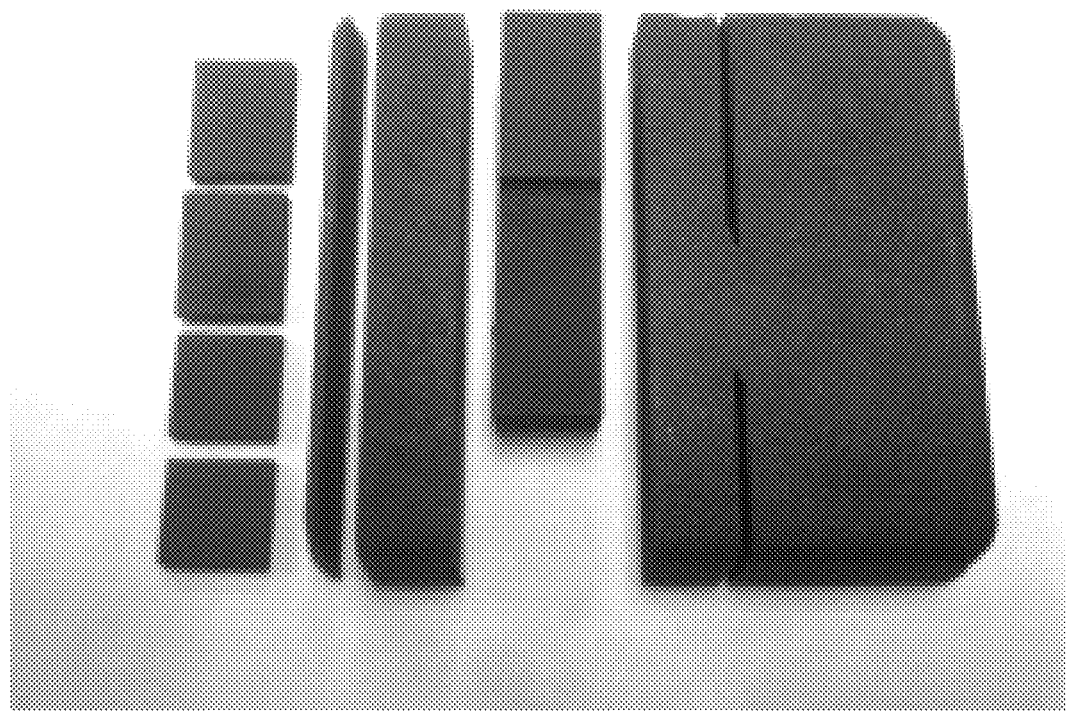
Figure 4C:
FIG. 4C shows thermal management products made by Wire EDM.

FIGS. 4A and 4B show RBSC articles made by RAM and Wire EDM, respectively. FIG. 4C shows thermal management products made by Wire EDM.

Lapping

As applied to the specific component that is a wafer chuck, once the pins and other required features have been "rough machined" into the body via EDM, the component is lapped, which lapping has several objectives, purposes or consequences: it removes some SiC and Si material, leaving the diamond reinforcement particles "standing proud" above the rest of the lapped surface; (ii) it grinds or polishes off the peaks of the diamond particles, leaving "mesas" or plateaus; and (iii) it provides an extremely flat surface; that is, the tops of the pins are at a very precise elevation. The lapping abrasive is diamond, with the following grit sizes used in order: 100, 45, 22, 12 and finally 6 micron-sized particulate. The latter is applied on a soft polyurethane cloth, while the other grits are applied using a ceramic plate.

Figure 5A:
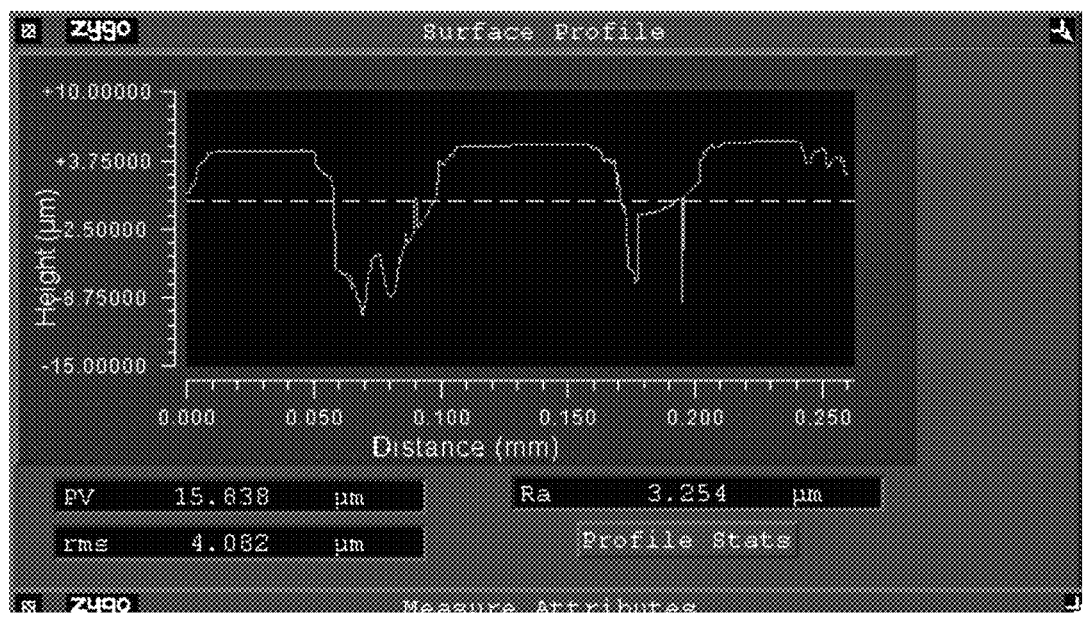
FIG. 5A shows a profilometer display (trace) for a lapped diamond-reinforced RBSC composite material.
Figure 5B:
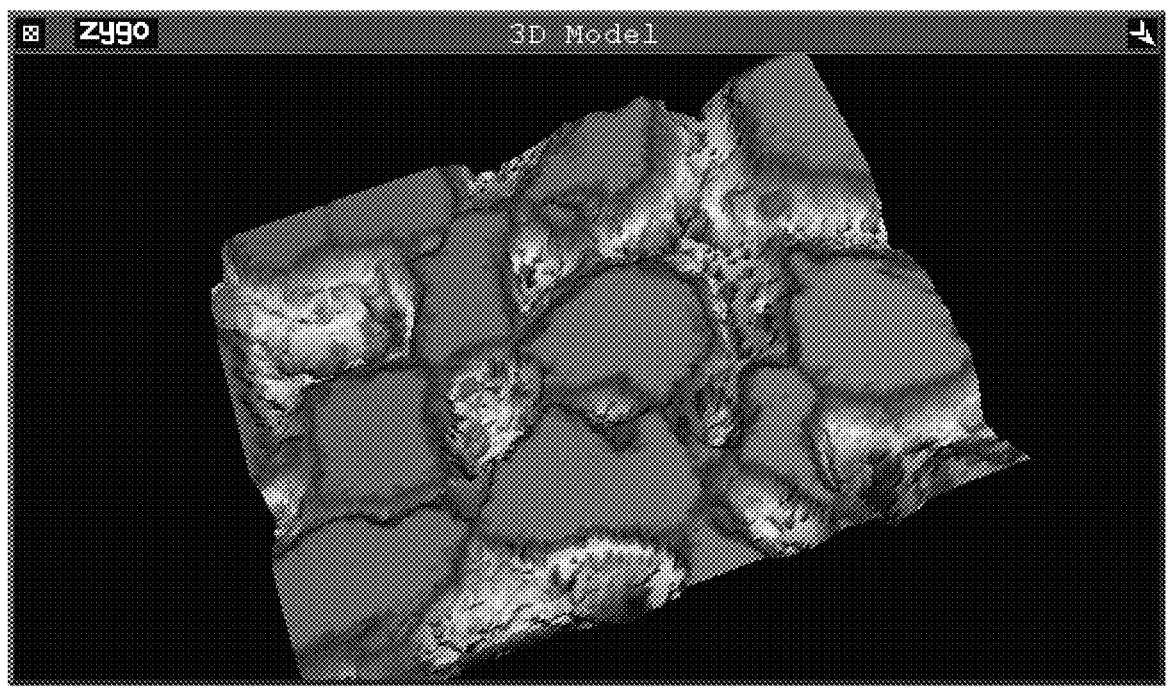
FIG. 5B is a grayscale scanning electron micrograph of a lapped diamond-reinforced RBSC composite where diamond is standing proud.

FIG. 5A shows a profilometer trace of the lapped diamond-reinforced RBSC body. FIG. 5B is a grayscale SEM image of the same lapped body. Both figures show that SiC and Si matrix material have been "scooped out" between diamond reinforcement grains, that the diamond grains have flat tops (have been "topped"), and that the edges of the diamond grains are radiused or rounded. If this surface is the top of a pin on a wafer chuck, it means that the contact surface will no longer be the entire top surface of the pin, but instead will be a plurality of smaller flat surfaces, which can be thought of as "micro pins".

This result is significant. The diamond reinforcement particles stand proud, so all wafer contact is with low contamination, low friction, and high hardness diamond. Moreover, the rounding of the edges of the diamond particles helps to prevent scratching of the silicon wafer. In addition, the exposed individual diamond particles act as micro-pins, which serve to minimize wafer contact area and thus the possibility for contamination.

It was stated previously that one may vary the diamond content of diamond-reinforced RBSC composite materials. One technique for doing so is mix the diamond particulate with one or more other reinforcement materials that are not diamond. One obvious choice in this regard is silicon carbide, SiC. Although a very hard substance, SiC is nevertheless not as hard as diamond. As such, reinforcement particles of SiC will be abraded during the lapping process, just as matrix SiC is abraded, resulting in "relief": the tops of the diamond particles are elevated relative to the non-diamond surface of the lapped article.

Scale-Up to 300 mm

Figure 6A:
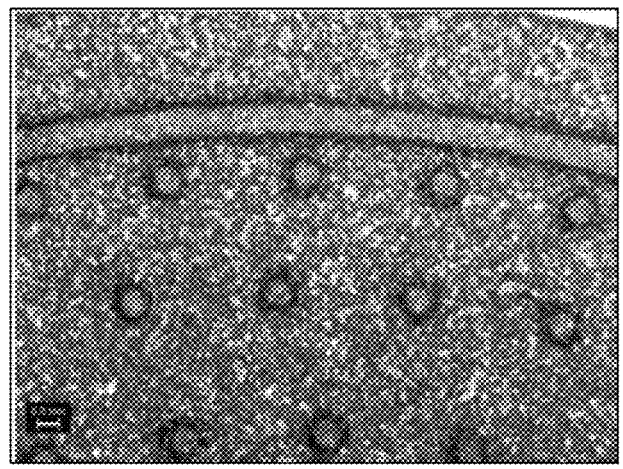
FIGS. 6A-6C are photographs at different degrees of magnification of a diamond-containing RBSC composite wafer chuck featuring a pinned surface.
Figure 6B:
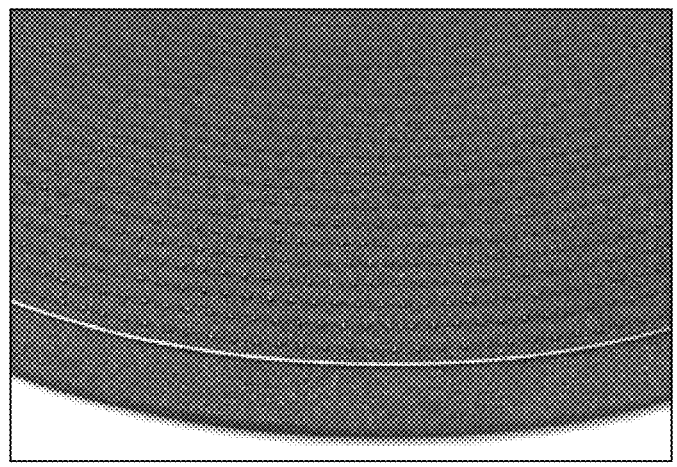
Figure 6C:
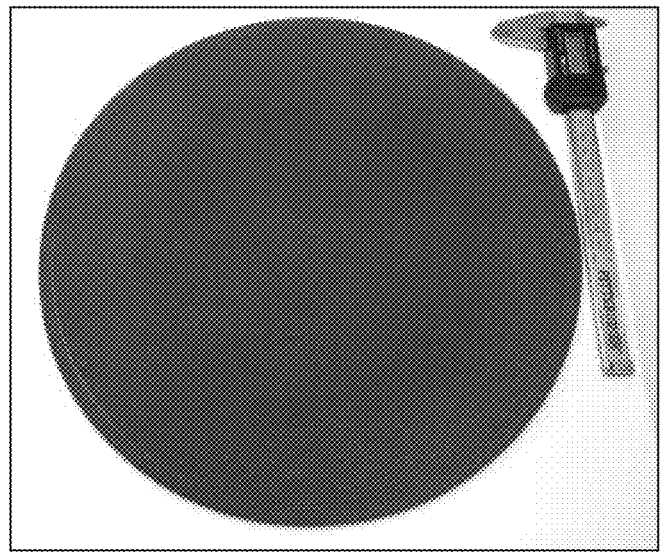

The Applicant has successfully produced 300 mm pinned components (i.e., measuring 300 mm in at least one dimension) using EDM machining followed by lapping. The process used to make 300 mm components is suited to production of larger sizes, such as 450 mm. FIGS. 6A through 6C are photographs of a 300 mm diameter wafer chuck taken at various magnification levels to show the pins, their arrangement, and the overall size of the component.

SUMMARY AND CONCLUSIONS

Diamond-containing composite materials such as diamond-reinforced reaction bonded silicon carbide (diamond-RBSC) can meet the requirements for the next generation of semiconductor wafer handling components. Key aspects of the Applicant's version of this composite material are:

Large size and shape capability (>450 mm)
Machinable by EDM (e.g., to create pinned surfaces)
Internal channel capability
Suited to lapping
Very high mechanical stability
Very high thermal stability
Extreme wear resistance
Low friction The wafer handling component, and in particular, the pinned surfaces, may be lapped using progressively finer grades of abrasive. The lapped surface (e.g., lapped pins) relieves or recesses the Si/SiC matrix component by an amount that is highly engineerable: the relief may be only a micron or a few microns, or 10 microns or several tens of microns. The lapping process also "tops" the diamond particles forming plateaus or mesas of uniform height. As a result, when a semiconductor wafer is brought into contact with such a lapped surface, the wafer only contacts diamond particles that are standing proud. Diamond is the ideal contact surface due to low wear, low friction, and low metallic contamination.

INDUSTRIAL APPLICABILITY

Although much of the foregoing discussion has focused on articles and devices for chucking semiconductor wafers, one of ordinary skill in the art will recognize other related applications where the diamond properties of low friction and low threat of contamination will be useful, for example in other aspects of semiconductor wafer handling such as Vacuum Wafer Table, Wafer Arms, End Effectors, and Susceptors.

The skilled person may also think of other applications beyond the field of semiconductor wafer handling where low wear, low friction and/or low contamination are desired. These application areas include, but are not limited to: bearing seals, cylinder liners, gun barrels, rifling for rail guns, lapping/grinding substrates, and human artificial joints (hips, knees, etc.).

The skilled person will appreciate that various modifications may be made to the invention herein described without departing from the scope or spirit of the invention as defined in the appended claims.

What is claimed is:

1. A semiconductor wafer handling article, comprising:
a surface configured to support a semiconductor wafer, said wafer support surface including a composite material that includes a matrix component and a reinforcement component including diamond particulate distributed throughout said matrix component,
wherein said matrix component has a recessed or relieved surface, leaving diamond particles of said diamond particulate standing proud relative to the recessed or relieved surface of the matrix component, such that all wafer contact is with said diamond particles, and
wherein said matrix component comprises reaction bonded silicon carbide,
wherein the matrix component is electrical discharge machinable,
wherein the semiconductor wafer handling article is selected from the group consisting of vacuum wafer chuck, electrostatic chuck, vacuum wafer table, wafer arm, and susceptor,
wherein the diamond particles have flattops with rounded edges formed by lapping, wherein the flattops are configured to support the semiconductor wafer, and wherein the flat tops of the diamond particles have a common elevation.

2. The article of claim 1, where a relief of the matrix component creates diamond micro-pins to minimize wafer contact area.

3. The article of claim 1, wherein said diamond particulate has a size of at least 22 microns.

4. The article of claim 1, wherein said diamond particulate makes up at least about 20 vol % of said composite material.

5. The article of claim 1, wherein said reinforcement component further comprises at least one phase other than diamond.

6. The article of claim 5, wherein said at least one phase other than diamond comprises SiC particulate, and wherein said diamond particulate is mixed with said SiC particulate.

7. The article of claim 5, wherein said at least one phase other than diamond is mixed with said diamond particulate.

* * * * *